(12) United States Patent
Oppelt et al.

(10) Patent No.: US 7,977,944 B2
(45) Date of Patent: Jul. 12, 2011

(54) CONTROL APPARATUS FOR A MAGNETIC RESONANCE IMAGING ANTENNA ARRANGEMENT

(75) Inventors: Ralph Oppelt, Uttenreuth (DE); Wolfgang Renz, Erlangen (DE); Wilfried Schnell, Forchheim (DE)

(73) Assignee: Siemens Aktiengesellschaft, Munich (DE)

( * ) Notice: Subject to any disclaimer, the term of this patent is extended or adjusted under 35 U.S.C. 154(b) by 226 days.

(21) Appl. No.: 12/369,041

(22) Filed: Feb. 11, 2009

(65) Prior Publication Data

US 2009/0201022 A1   Aug. 13, 2009

(30) Foreign Application Priority Data

Feb. 11, 2008   (DE) .......................... 10 2008 008 502

(51) Int. Cl.
*G01V 3/00* (2006.01)
(52) U.S. Cl. ........................................ 324/318; 324/322
(58) Field of Classification Search .......... 324/300–322; 333/219–235; 600/407–445
See application file for complete search history.

(56) References Cited

U.S. PATENT DOCUMENTS

| 5,427,102 A * | 6/1995 | Shimode et al. ............. 600/410 |
|---|---|---|
| 6,100,693 A | 8/2000 | Eberler et al. |
| 7,015,692 B2 * | 3/2006 | Clarke et al. .................. 324/300 |
| 7,397,244 B2 * | 7/2008 | Cirel ............................. 324/318 |
| 7,570,056 B2 * | 8/2009 | Nakabayashi et al. ........ 324/318 |
| 7,602,187 B2 * | 10/2009 | Luedeke et al. .............. 324/318 |
| 7,622,927 B2 * | 11/2009 | Griswold et al. ............. 324/318 |
| 2005/0030028 A1 | 2/2005 | Clarke et al. |
| 2006/0082370 A1 | 4/2006 | Cirel |
| 2008/0272786 A1 | 11/2008 | Luedeke et al. |

* cited by examiner

*Primary Examiner* — Brij B Shrivastav
(74) *Attorney, Agent, or Firm* — Schiff Hardin LLP

(57) ABSTRACT

An apparatus to control an antenna arrangement in a magnetic resonance apparatus has an amplifier with an input connected to a radio-frequency transmission signal to be amplified. The antenna arrangement has at least one antenna element for emission of the amplified transmission signal. The antenna element has an infeed point with two terminals, wherein the amplified transmission signal is connected at the terminals. The amplifier is connected on the output side with two terminals of the infeed point. The antenna element has at the infeed point, a mounting surface to accommodate the amplifier.

11 Claims, 4 Drawing Sheets

FIG 1
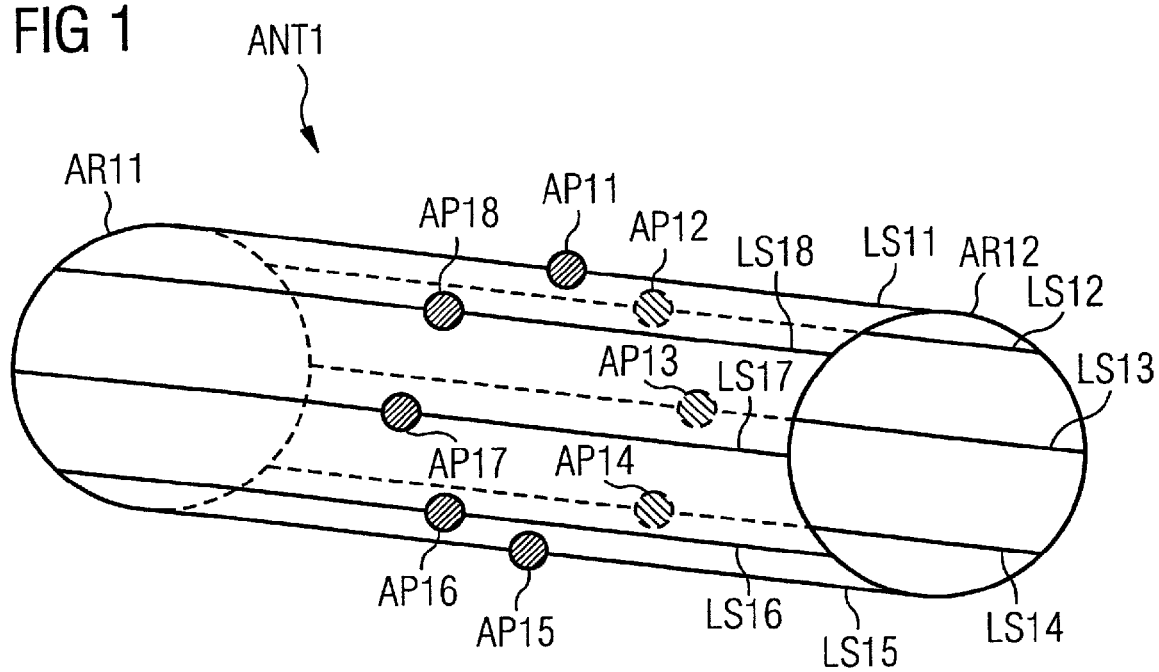
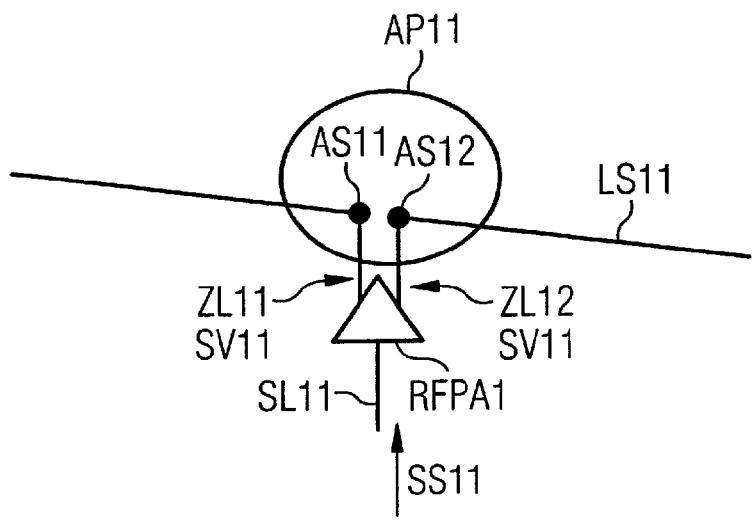

FIG 3
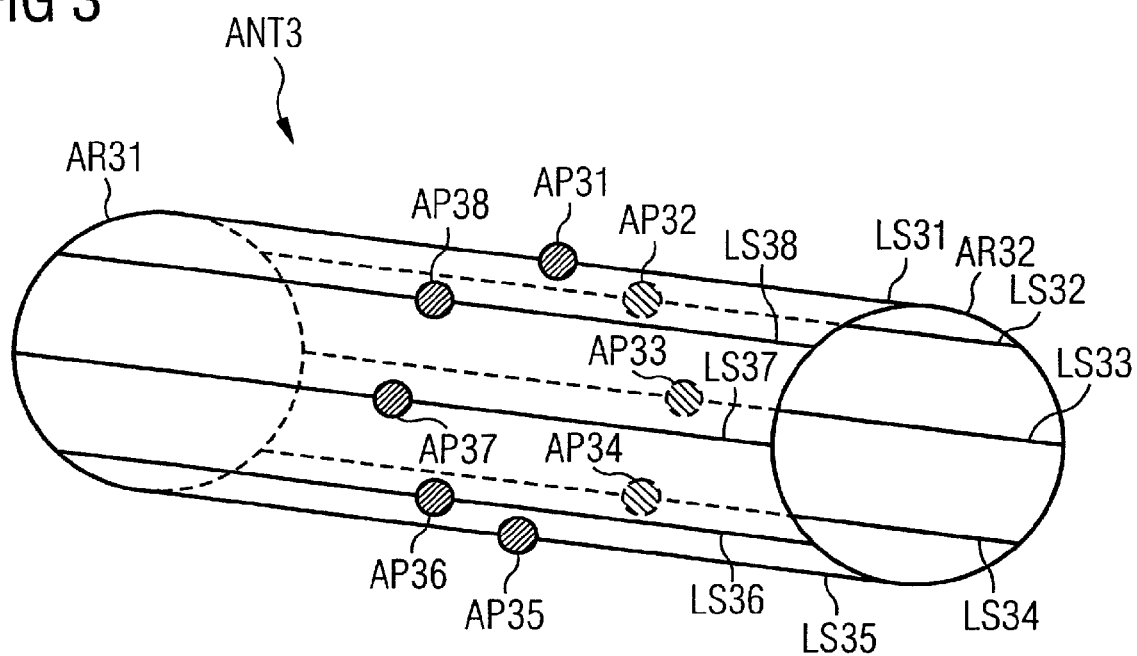
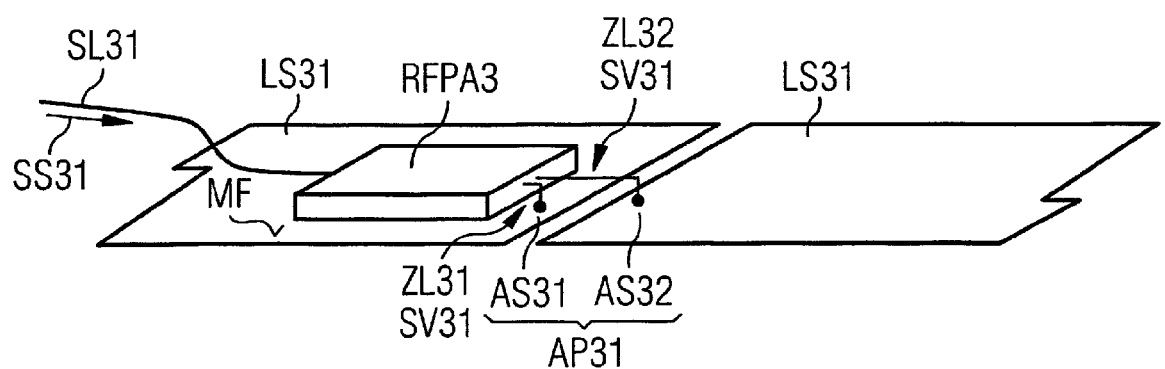

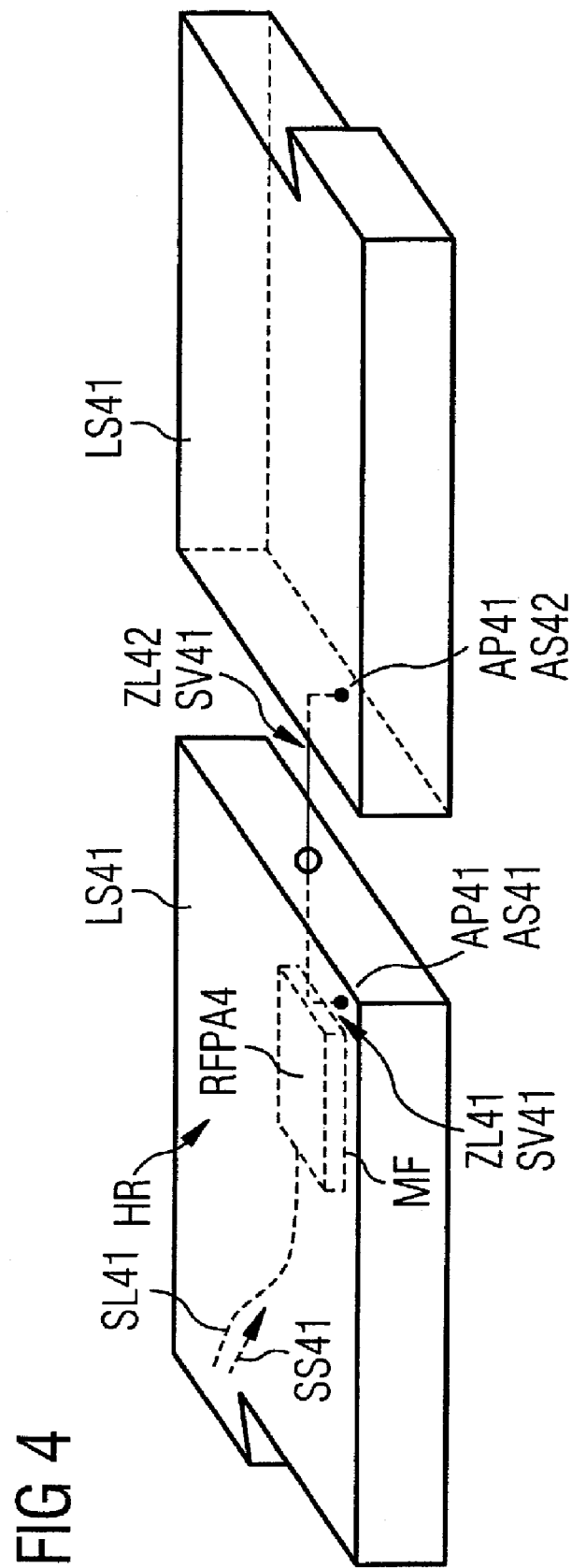

CONTROL APPARATUS FOR A MAGNETIC RESONANCE IMAGING ANTENNA ARRANGEMENT

BACKGROUND OF THE INVENTION

1. Field of the Invention

The present invention concerns an apparatus to control an antenna arrangement in a magnetic resonance apparatus.

2. Description of the Prior Art

Magnetic resonance apparatuses with a transmission antenna for multi-channel measurements are increasingly gaining importance.

FIG. 1 shows a first activation of an antenna arrangement ANT1 according to the prior art.

The antenna arrangement ANT1 here is fashioned as a cylindrical birdcage antenna and serves for acquisition of a patient in a magnetic resonance examination.

The antenna arrangement ANT1 has eight longitudinal rods LS11 through LS18. Both ends of the longitudinal rods LS11 through LS18 are connected with one another by respective circular termination rings AR11 and AR12. Each termination ring has capacitors in the circumferential direction as needed.

The shown antenna arrangement ANT1 is designed for a multi-channel system so that each longitudinal rod LS11 through LS18 has an associated infeed point AP11 through AP18. Amplified transmission signals for emission are respectively connected at each of the infeed points AP11 through AP18. The transmission signals differ from one another.

Only one infeed situation at a first infeed point AP11 of a first longitudinal rod LS11 is described in the following as an example.

The infeed situation at the infeed points AP12 through AP18 is correspondingly designed.

The first longitudinal rod LS11 serves as an antenna element and has the first infeed point AP11 with two connections AS11 and AS12. An amplified transmission signal SV11 for emission is connected at the two connections AS11 and AS12.

The amplified transmission signal SV11 is formed by an amplifier RFPA1 at whose input a radio-frequency signal SS11 arrives via a signal line SL11.

The amplifier RFPA1 is connected at the output side via two feed lines ZL11 and ZL12 with the two connections AS11 and AS12 of the infeed point AP11.

As an alternative (not shown), it is possible for a number of the infeed points to be arranged on one of the termination rings at which transmission signals of different amplification are connected for a multi-channel system for emission.

The type of antenna excitation shown here is designated as a "single rod excitation".

FIG. 2 shows a second control of an antenna arrangement ANT2 according to the prior art.

The antenna arrangement ANT2 here is fashioned in an arc and has a curved antenna element SE21 with an infeed point AP21.

The infeed point AP21 has two connections AS21 and AS22 at which an amplified transmission signal SV21 is connected for emission.

The amplified transmission signal SV21 is formed by an amplifier RFPA2 at whose input a radio-frequency signal SS21 arrives via a signal line SL21.

The amplifier RFPA2 is connected at the output side via two feed lines ZL21 and ZL22 with the two connections AS21 and AS22 of the infeed point AP21.

However, the two embodiments described have disadvantages, as follows.

The amplified transmission signals are presently directed from the amplifier outputs to the infeed points via relatively thick, low-attenuation coaxial lines of specific capacity. Due to the unwieldy coaxial cables, this solution is difficult to manage and is also error-prone, depending on the wiring arrangement.

The transmission signals to be amplified are correspondingly also directed via coaxial lines to the associated amplifiers.

It should be noted that additional signal attenuations are caused even given use of low-attenuation coaxial cables.

SUMMARY OF THE INVENTION

It is an object of the present invention to specify a control of an antenna arrangement that is improved with regard to the signal attenuation.

The arrangement according to the invention to control an antenna arrangement in a magnetic resonance apparatus has an amplifier at whose input is connected a radio-frequency transmission signal to be amplified.

The antenna arrangement has at least one antenna element to radiate the amplified transmission signal. The antenna element possesses an infeed point with two terminals, wherein the amplified transmission signal is connected at the terminals. The amplifier is connected at the output end with both terminals of the infeed point. According to the invention, at the infeed point the antenna element possesses a mounting surface to accommodate the amplifier.

The transmission power amplifier (or in a multi-channel system, the transmission power amplifiers) is (are) thereby arranged close to the antenna. It is thereby possible to avoid previously used, unwieldy coaxial cables since power losses are negligible due to the short paths between the amplifier outputs and the associated infeed points.

With the arrangement according to the invention it is also possible to fashion necessary conductor lengths between a given amplifier output and the associated infeed points extremely short. Power losses and signal attenuations are therefore reduced or, respectively, avoided.

In a preferred development, the transmission signals to be amplified are directed via optical conductors to the amplifier inputs. The optical conductors are delicate and therefore easily handled, such that the tendency towards error in the cables is advantageously reduced.

In a preferred embodiment, the amplifier is fastened in a heat-conductive manner on the mounting surface so that the antenna arrangement can be used at least in part as a heat sink. It is therefore achieved that additional heat that is formed by the transmission power amplifier or, respectively, transmission power amplifiers can be dissipated via the antenna arrangement.

This embodiment is advantageous because, due to the limited space relationships in the antenna arrangement, it is not additionally possible to install an additional cooling for heat dissipation.

In a further advantageous embodiment, the transmission power amplifier or transmission power amplifiers in the antenna arrangement are additionally shielded in order to avoid or, respectively, to reduce a mutual influencing of the amplifier on the one hand and the antenna field on the other hand.

In another embodiment, the amplifier is arranged in a hollow space of the antenna arrangement so that this hollow space can simultaneously be used as an additional shielding of the amplifier.

BRIEF DESCRIPTION OF THE DRAWINGS

FIG. 1 shows the first control of an antenna arrangement described in the preceding, according to the prior art.

FIG. 3 shows a first control embodiment for an antenna arrangement according to the invention.

FIG. 4 shows a second embodiment of the invention to control an antenna arrangement.

DESCRIPTION OF THE PREFERRED EMBODIMENTS

Figure 2:
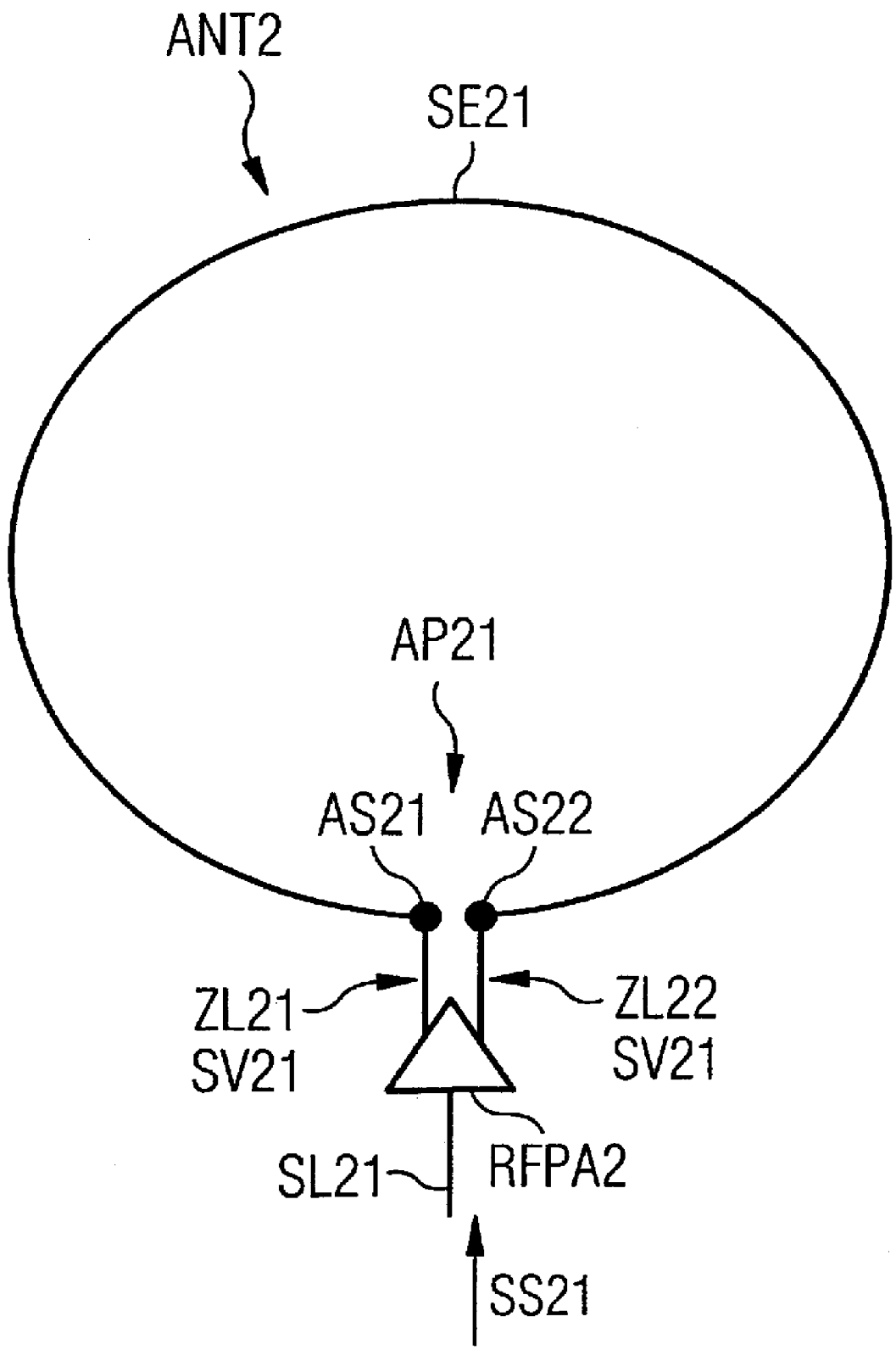
FIG. 2 shows the second control of an antenna arrangement described in the preceding, according to the prior art.

FIG. 3 shows a first control of an antenna arrangement ANT3 according to the invention.

The antenna arrangement ANT3 here is fashioned as a cylindrical birdcage antenna and serves for acquisition of a patient in a magnetic resonance examination.

The antenna arrangement ANT3 exemplarily possesses eight longitudinal rods LS31 through LS38. Both ends of the longitudinal rods LS31 through LS38 are respectively connected with one another by circular termination rings AR31 and AR32.

The antenna arrangement ANT3 here is designed for a multi-channel system so that the shown longitudinal rods LS31 through LS38 respectively possess an associated infeed point AP31 through AP38. An amplified transmission signal for emission is respectively connected at each of the infeed points AP31 through AP38, wherein the transmission signals are different from one another.

An infeed situation at a first infeed point AP31 of a first longitudinal rod LS31 is described in the following as a representative for all other infeed points AP32 through AP38.

The infeed situation is thus correspondingly designed in the infeed points AP32 through AP38.

As an antenna element, the first longitudinal rod LS31 possesses the first infeed point AP31 with two terminals AS31 and AS32.

An amplified transmission signal SV31 for emission is connected at the two terminals AS31 and AS32.

The amplified transmission signal SV31 is formed by an amplifier RFPA3 at whose input a radio-frequency transmission signal SS31 arrives via a signal line SL31.

The amplifier RFPA3 is connected at the output end with the two terminals AS31 and AS32 of the infeed point AP31 via two extremely short feed lines ZL31 and ZL32.

As an alternative (not shown), it is possible for a number of the infeed points to be arranged on one of the termination rings at which transmission signals of different amplification for a multi-channel system are connected for emission.

According to the invention, the antenna element LS31 has, at the infeed point AP31, a mounting surface MF that is fashioned to accommodate the amplifier RFPA3. The amplifier RFPA3 is attached in a heat-conductive manner to the mounting surface MF.

The entire antenna arrangement ANT3 can therefore advantageously be used for heat dissipation of the amplifier RFPA3. This is in particular advantageous in a multi-channel system because here greater heat outputs in the antenna system are formed due to the plurality of amplified transmission signals.

By the direct arrangement of the amplifier at the infeed point it is possible to design the feed lines ZL31 and ZL32 extremely short so that signal attenuations due to line lengths are avoided.

In an advantageous development (not shown here), the amplifier RFPA3 possesses an additional shielding in order to protect it from radiations of the entire antenna arrangement ANT3 and in order to reduce an unwanted escape of its own perturbing radiation.

In another development (not shown here), the antenna arrangement is additionally cooled for improved heat dissipation.

For example, in a first embodiment the antenna arrangement is additionally cooled with the aid of injected air. This solution lends itself to use because here the radio-frequency properties of the antenna arrangement are essentially unaffected.

In a further second embodiment, the cooling ensues with the aid of water. For example, metalized, water-conducting hoses or pipes are attached in a heat-conductive manner at selected points of the antenna arrangement. These points are designed such that required radio-frequency properties of the antenna arrangement do not change, or change only slightly.

In an advantageous development, the dissipated heat is transferred to a radio-frequency shield that two-dimensionally surrounds the antenna arrangement anyway and therefore possesses good heat conduction properties for heat dissipation.

As illustrated above, suitable contact points for heat transfer are also selected on the radio-frequency shield.

In a further third embodiment, an antenna arrangement that possesses at least partially hollow antenna structures is cooled with water. The water is then provided in the hollow spaces of the antenna arrangement for cooling, wherein feed lines and outgoing lines for the water transport are provided at the antenna arrangement. The heat transport to the external environment of the antenna array ensues via these.

Electrically insulating plastic hoses for coolant water transport are advantageously used in order to essentially not affect the properties of the antenna in its surroundings.

In addition to water, other cooling fluids can also be used that are preferably not electrically conductive in order to not disrupt or, respectively, to not affect the measurement results, and therefore the imaging in the magnetic resonance examination.

FIG. 4 shows a second embodiment of the invention to control an antenna arrangement.

Here an antenna element LS41 possesses a hollow space at at least one of the two infeed points AS41 or AS42; for example, the entire antenna element LS41 is fashioned as a hollow, metallic conductor.

An amplifier RFPA4 is fastened in a heat-conductive manner on the mounting surface MF in this hollow space.

A shielding of the amplifier RFPA4 from radiations of the antenna arrangement (which is part of the antenna element LS41) ensues via the metallic encapsulation of the amplifier RFPA4 in the hollow space HR.

An amplified transmission signal SV41 for emission is connected at the two terminals AS41 and AS42.

The amplified transmission signal SV41 is formed by an amplifier RFPA4 at whose input a radio-frequency transmission signal SS41 arrives via a signal line SL41.

The amplifier RFPA4 is connected at its output with the two terminals AS41 and AS42 of the infeed point AP41 via two extremely short feed lines ZL41 and ZL42.

To improve the shielding, a first feed line ZL41 can be directly connected inside the hollow space HR with the first infeed point AS41, while a second feed line ZL42 is connected across a gap with the second infeed point AS42.

Although modifications and changes may be suggested by those skilled in the art, it is the intention of the inventors to embody within the patent warranted hereon all changes and modifications as reasonably and properly come within the scope of their contribution to the art.

We claim as our invention:

1. A control apparatus for an antenna, comprising:
    an amplifier having an input supplied with a radio-frequency transmission signal that is amplified in said amplifier, said amplifier having an amplifier output at which the amplified radio-frequency transmission signal is emitted;
    an antenna arrangement comprising at least one antenna element configured to emit the amplified radio-frequency transmission signal in a magnetic resonance apparatus;
    said antenna element comprises an infeed point with two terminals connected to said amplifier output to receive said amplified radio-frequency transmission signal therefrom; and
    said antenna element comprising, at said infeed point, a mounting surface on which said amplifier is mounted.

2. A control apparatus as claimed in claim 1 comprising a heat-conductive mounting that mounts the amplifier to said mounting surface to make at least a portion of said antenna arrangement a heat sink for said amplifier.

3. A control apparatus as claimed in claim 1 wherein said antenna arrangement is selected from the group consisting of cylindrical antenna arrangements, Frustum-shaped antenna arrangements, and birdcage antenna arrangements.

4. A control apparatus as claimed in claim 1 wherein said antenna arrangement comprises a plurality of longitudinal rods each having opposite ends, and two termination rods respectively disposed at the opposite ends of said longitudinal rods that electrically connect said longitudinal rods to each other, and a plurality of amplifiers, including said amplifier, connected respectively to a plurality of infeed points distributed around said terminal rings or said longitudinal rods, and a plurality of mounting surfaces at said antenna arrangement at which said plurality of amplifiers are respectively mounted, each amplifier and the infeed point connected thereto forming a channel of a multi-channel transmission system.

5. A control apparatus as claimed in claim 1 wherein said antenna element comprises a hollow space at said input point, and wherein said mounting surface is located in said hollow space, said hollow space shielding said amplifier from radiation by said antenna arrangement.

6. A control apparatus as claimed in claim 1 wherein said amplifier comprises a shielding that shields said amplifier against radiation by said antenna arrangement.

7. A control apparatus as claimed in claim 1 comprising a cooling system in thermal communication with said antenna arrangement to cool said antenna arrangement.

8. A control apparatus as claimed in claim 7 comprising an injected error system that additionally cools said antenna arrangement by injected air.

9. A control apparatus as claimed in claim 7 wherein said antenna arrangement is connected at selected points with coolant-carrying conduits.

10. A control apparatus as claimed in claim 7 comprising a radio-frequency shield that two-dimensionally surrounds said antenna arrangement, said radio-frequency shield also being thermally conductive to transfer heat away from said antenna arrangement.

11. A control apparatus as claimed in claim 7 comprising a plurality of hollow antenna structures that contain and carry a coolant that additionally cools said antenna arrangement.

* * * * *